United States Patent
Al-Shamma

(10) Patent No.: US 6,215,705 B1
(45) Date of Patent: Apr. 10, 2001

(54) SIMULTANEOUS PROGRAM, PROGRAM-VERIFY SCHEME

(75) Inventor: Ali Al-Shamma, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/501,448

(22) Filed: Feb. 10, 2000

(51) Int. Cl.[7] ............................................ G11C 7/00
(52) U.S. Cl. ........................ 365/189.04; 365/230.03; 365/230.04
(58) Field of Search ................... 365/189.04, 230.04, 365/230.03, 189.07, 191

(56) References Cited

U.S. PATENT DOCUMENTS

| | | | |
|---|---|---|---|
| 5,263,003 | * 11/1993 | Cowles et al. | 365/230.03 |
| 5,495,442 | 2/1996 | Cernea et al. | 365/185.03 |
| 5,847,998 | 12/1998 | Buskirk | 365/185.33 |
| 5,867,430 | 2/1999 | Chen et al. | 365/189.04 |

* cited by examiner

Primary Examiner—David Nelms
Assistant Examiner—Thong Le
(74) Attorney, Agent, or Firm—Brinks Hofer Gilson & Lione

(57) ABSTRACT

A memory device is split into two or more memory banks. Each bank includes a number of sectors. Each Sector includes memory cells. While one bank is busy with program operation, the other bank can be simultaneously engaged in program-verify operation during the same cycle.

10 Claims, 2 Drawing Sheets

SIMULTANEOUS PROGRAM, PROGRAM-VERIFY SCHEME

BACKGROUND OF THE INVENTION

The present invention relates generally to electrically erasable and programmable non-volatile memories. More particularly, this invention relates to a method and circuit that speeds up the programming and program verification operations of a memory device by simultaneously programming in one bank and verifying the programming in another bank of a memory device.

Electronic systems typically include processors and memory. The memory is used to store instructions and data. In some systems, such as cellular phones, non-volatile memory is needed to ensure that the stored data is not lost even when the system is turned off. One non-volatile memory family is Read Only Memory (ROM), Programmable ROM (PROM), and Erasable-Programmable ROM (EPROM), with varying degrees of flexibility of use. ROM memories have high density, low power consumption, and high performance, but they are not in-system updateable. On the other hand is the volatile memory family of Random Access Memory (RAM), Dynamic RAM (DRAM), and battery-backed Static RAM (SRAM). The RAM family, however, is in-system updateable and has high performance, but it is volatile. DRAM stores temporary data, and SRAM integrates a battery to retain stored data when system power is removed. SRAM is considerably more expensive than DRAM. Electrically-Erasable-Programmable ROM (EEPROM) is a special kind of ROM that is in-system modifiable on a byte-by-byte basis, like RAM, but it is also non-volatile, like ROM.

Flash memory is one type of inherently nonvolatile memory, with no refresh or battery requirements, which can be read, erased, or programmed in units of memory such a sectors or banks. It is a variation of EEPROM which, unlike flash memory, is erased and rewritten at the byte level, which is slower than flash memory updating. Flash memory is often used to hold control code such as BIOS in personal computer. When BIOS needs to be changed, the flash memory can be updated in block (rather than byte) sizes, making it easy to update. Flash memory is used in digital cellular phones, digital cameras, LAN switches, PC cards for notebook computers, digital set-up boxes, embedded controllers, and other devices. Flash memory is in-system updateable. Its simpler cell architecture (only one transistor) gives it significant density advantages over both EEPROM and SRAM, and compares favorably with densities achieved by ROM and DRAM on analogous manufacturing processes. Finally, flash memory is the only approach to satisfy the desired characteristics of nonvolatility, upgradeability, high density, and low cost.

One problem with prior flash memories is that they do not provide sufficient random access. For example, prior flash memory devices typically do not allow a processor to perform a program-verify operation while a program operation is underway in the memory device. Typically, the processor periodically polls a status register of the flash memory device to detect the end of the program operation before initiating a program-verify operation of the memory device. That is, a processor should wait until a program cycle is complete before initiating a program-verify cycle, because both program and program-verify operations cannot be performed simultaneously.

While prior art memory systems allow simultaneous read and write operations, they suffer from the problem that they can only do asynchronous (not clocked) memory read operation in combination with another embedded memory operation, such as embedded memory program or embedded memory erase operations. Embedded memory operations are command-sequence-mode operations which are carried out by writing a specific address and data sequence into a sequence register. Because asynchronous memory read operation is not a command-sequence-mode (embedded) operation, rather it is a direct-mode-operation like a default operation, prior art memory systems are not capable of simultaneously performing two command-sequence-mode (embedded) operations such as memory erase, memory write, and memory program-verify operations. Therefore, there is a need for an efficient flash memory device that allows simultaneous embedded program and program-verify operations in the same cycle.

BRIEF SUMMARY

By way of introduction only, the present invention provides simultaneous program and program-verify operations for a non-volatile memory device. In one preferred embodiment, a memory device is divided into two or more banks. Each bank includes a number of sectors. Each sector includes a set of memory cells. Each bank has a decoder that selectively receives an address from an input address buffer or from an internal address sequencer controlled by an internal state machine. When one bank receives a program command, the internal state machine takes control and starts the program operation, while the other bank can be accessed for program-verify operation.

One preferred embodiment of the present invention is to split the memory into upper bank and lower bank. The data to be programmed is also split into even-addressed data words and odd-addressed data words. The even-addressed data words and the odd-addressed data words are programmed alternatively into upper bank and lower bank, respectively. After programming a word of data into either upper bank or lower bank, the processor initiates the program-verify operation of the same word of data, while simultaneously programming the next word of data into the other bank. This process is repeated over time until the last word of data is programmed and program-verified. Therefore, there is always a word of data being-verified while another word of data is being programmed, during the same cycle.

Additional objects, features and advantages of the various aspects of the present invention will become apparent from the following description of its preferred embodiments, which description should be taken in conjunction with the accompanying drawings.

DETAILED DESCRIPTION OF THE PRESENTLY PREFERRED EMBODIMENTS

Figure 1:
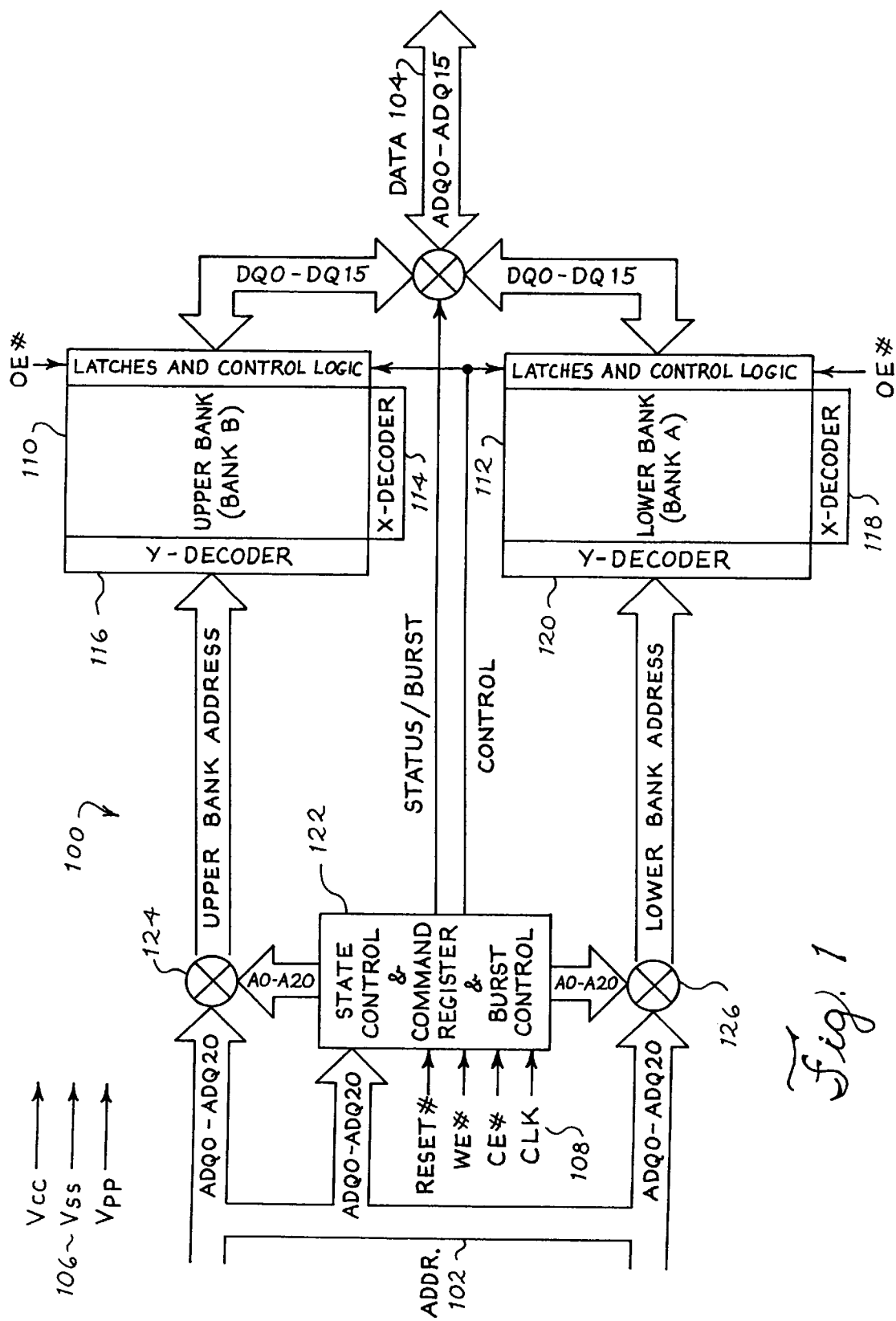
FIG. 1 is a block diagram of a memory device.

FIG. 1 illustrates a non-volatile memory device 100 that enables simultaneous program and program-verify operations according to one embodiment. Memory device 100 includes an address input (Addr) 102, a data input/output (Data) 104, power inputs (Vcc, Vss, and Vpp) 106, and control inputs 108. The control inputs 108 include Reset (RESET#), Write Enable (WE#), Chip Enable (CE#), Clock (CLK), and Output Enable (OE#). The Chip Enable signal activates the chip's control logic and input buffers (not shown). When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip.

Memory device 100 is configured into an upper bank 110 and a lower bank 112 that are arrays (or sectors) of flash memory cells. However, other non-volatile memories are also within the scope of the present invention. The memory banks 110 and 112 are arranged in arrays of memory cells with pre-determined numbers of rows and columns. The address decode logic for upper bank 110 includes X decode 114 and Y decode 116. The address decode logic for lower bank 112 includes X decode 118 and Y decode 120.

State machine and control logic 122 provides the control for read, program, program-verify, and erase operations. Many of the selection lines used to select between upper bank and lower bank are controlled by state machine and control logic 122. Alternatively, some sector decoders may be provided whose output can be used to select between banks of memory cells. A more detailed description of the memory device 100 in FIG. 1 can be found in U.S. Pat. No. 5,867,430, Bank Architecture For A Non-volatile Memory Enabling Simultaneous Reading and Writing, and U.S. Pat. No. 5,847,998, Non-volatile Memory Array That Enables Simultaneous Read and Write Operations. These patents are assigned to the assignee of the present invention and are incorporated herein by reference.

Memory device 100 is programmed using an embedded programming command sequence and is program-verified using an embedded program-verify command sequence. The embedded sequences allow a processor to initiate a program or program-verify sequence and perform other tasks while the program and program-verify operations are being carried out. The embedded program and program-verify sequences are controlled by state machine and control logic 122, which uses a command register (not shown) to manage the commencing of either command sequence. The program and program-verify operations are accessed via the command register, which controls an internal state machine that manages device operations. Commands are written to the command register via the data input 102 to memory device 100.

While one bank is being programmed, the other bank can be accessed for a program-verify operation. For example, during a program or program-verify operation of a data word in upper bank, state machine and control logic 122 would cause multiplexer 124 to select the upper bank address for communication to decoders 114 and 166. Similarly, during a program or program-verify operation of a data word in lower bank, state machine and control logic 122 would cause multiplexer 126 to select the lower bank address for communication to decoders 118 and 120.

Figure 2:
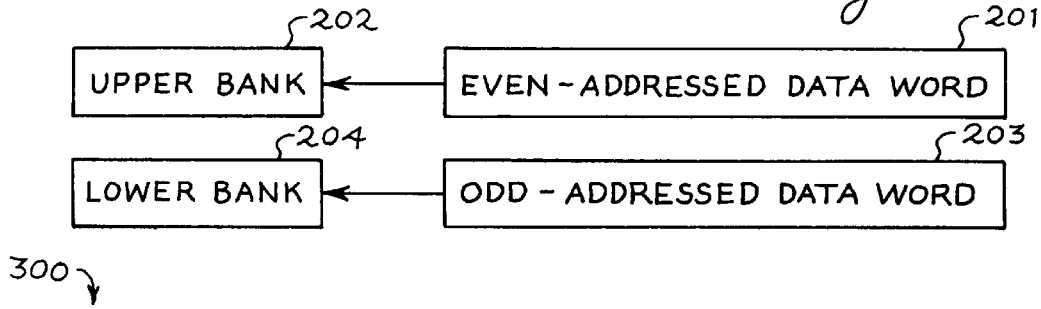
FIG. 2 is a block diagram of a memory unit according to one embodiment.
Figure 3:
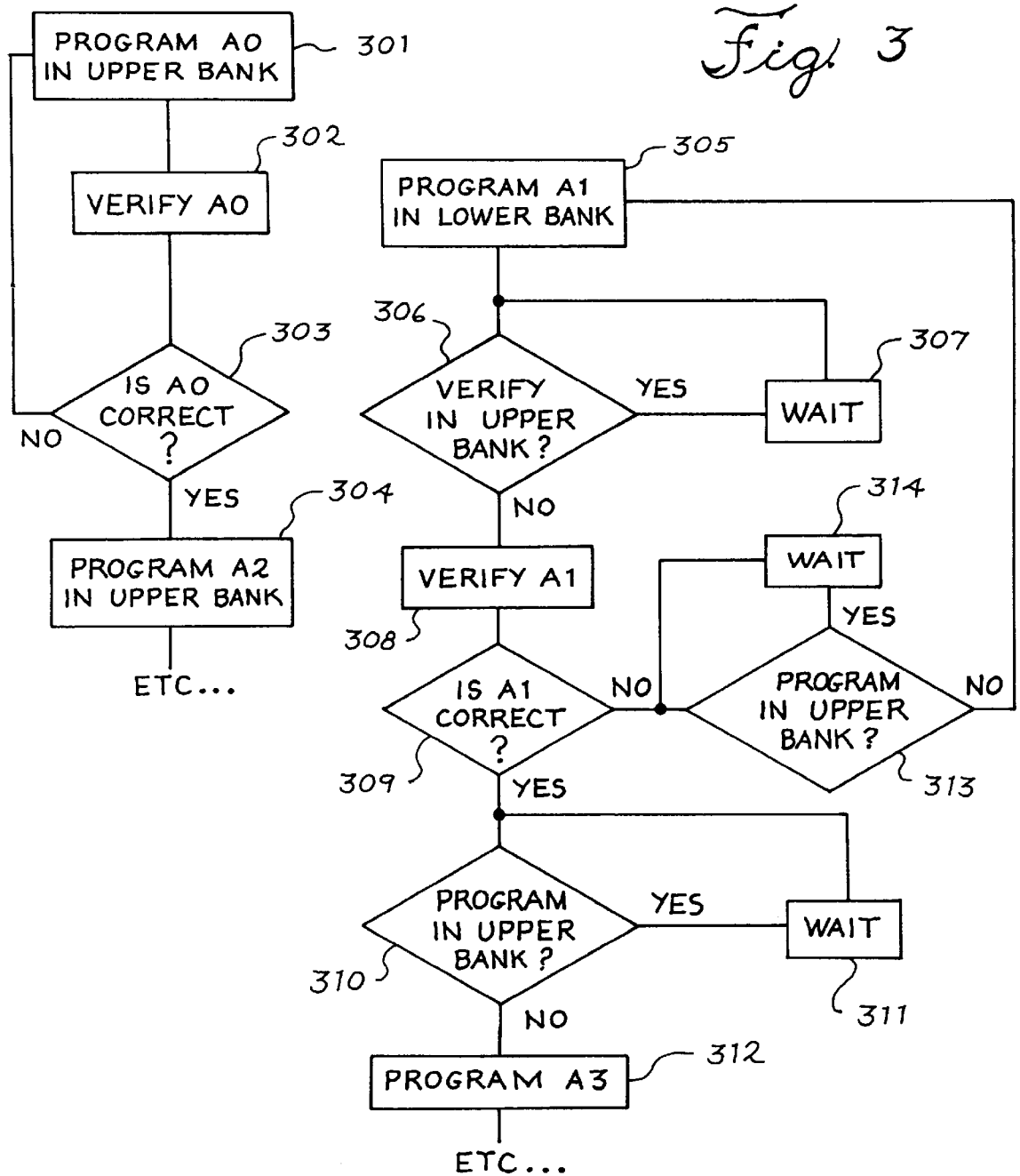
FIG. 3 is a flow chart for describing a preferred embodiment of the present invention.

Now, a detailed description of one embodiment of the present invention is given in reference to FIG. 2 and FIG. 3. FIG.2 illustrates how a word of data is programmed or written in the memory banks. As mentioned before, the even-addressed data words 201 are written into the upper bank 202, while the odd-addressed data words 203 are written into the lower bank 204. FIG. 3 shows a flowchart 300 showing the detailed process of simultaneous program and program-verify according to one embodiment of this invention. The left portion of FIG. 3 illustrates the sequence of acts for programming and program-verifying the even-addressed data words 201 into the upper bank 202 in FIG. 2. The right portion of FIG. 3 illustrates the sequence of acts for programming and program-verifying the odd-addressed data words 203 into the lower bank 204 in FIG. 2. Initially, in act 301, the first even-addressed word of data, which is located at address A0 (Hex), is programmed into the upper bank 202 in FIG. 2. At the completion of this programming act, the two acts of 302 and 305 are initiated simultaneously. In act 302 and 303, while the programming of the first even-addressed data word in the upper bank is verified for correctness, the first odd-addressed data word, which is located at address A1 (Hex), is programmed into lower bank in act 305. At the completion of act 303, if the programming operation of the first even-addressed data word into the upper bank was successfully performed, as determined by "Y" in act 303, then the second even-addressed data word, which is located at A2(Hex), is written into the upper bank in act 304. However, if the programming operation of the first even-addressed data word into the lower bank was not successfully performed, as determined by "N" in act 303, then the same data has to be programmed again into the upper bank. The sequence of acts 302, 303, and 304 are repeated until the last even-addressed data word is successfully programmed and program-verified. In the meantime, after the programming the first odd-addressed data word into the lower bank in act 305 is complete, its program-verify operation is delayed, through acts 306 and 307, until the program-verify operation of the fist even-addressed data word in the upper bank is complete. Then, the program-verify operation of the first odd-addressed data word in the lower bank is carried out in act 308 and 309, simultaneously with the program operation of the second even-addressed data word into the upper bank in act 304. If the programming operation of the first odd-addressed data word into the lower bank was successfully performed, , as determined by "Y" in act 309, then the programming of the second odd-addressed data word, which is located at address A3(Hex), is delayed, through acts 310 and 311, until programming of second even-addressed data word into upper bank is complete. However, if the programming operation of the first odd-addressed data word in lower bank was not successfully performed, as determined by "N" in act 309, then the same data has to be programmed again into the lower bank, but only after making sure, through acts 313 and 314, that there is no programming operation going on in the upper bank. The sequence of acts 305, 306, 307, 308, 309, 310, 311, 312, 313, and 314 are repeated until the last odd-addressed data word is successfully programmed and program-verified.

Therefore, while one memory bank is being programmed with a word of data, the other memory bank is simultaneously being program-verified. Consequently, the programming operation is made faster and more reliable.

What is claimed is:

1. A method for simultaneous program and program-verify operations in a memory device comprising a plurality of banks of memory cells, said method comprising:
   (a) arranging the memory device into upper and lower banks of memory cells;
   (b) programming a first data word into the upper bank;
   (c) programming a second data word into the lower bank; and
   (d) program-verifying the first data word simultaneously with said programming said second data word.

2. The method of claim 1 wherein (a) includes arranging a flash memory into upper and lower banks of memory cells.

3. The method of claim 1 wherein (b) includes programming an even-addressed data word into the upper bank, and act (c) includes programming an odd-addressed data word into the lower bank.

4. The method of claim 1 further including:
   (e) repeating (b) and (d) if (d) indicated that the programming of the first data was not successfully performed.

5. The method of claim 1 further including:
   (e) program-verifying the second data after (d) is successfully performed.

6. A computer memory device comprising:
   (a) a memory unit configured into upper and lower banks of memory cells;
   (b) means for simultaneously programming and program-verifying said memory unit, said means comprising:
      (b1) first means for programming a first data word into the upper bank;
      (b2) second means for programming a second data word into the lower bank; and
      (b3) third means for program-verifying the first data word simultaneously with said programming said second data word.

7. The memory device of claim 6 wherein said memory unit is flash memory.

8. The memory device of claim 6 wherein said first data word is an even-addressed data word, and said second data word is an odd-addressed data word.

9. The memory device of claim 6 further including:
   (b4) forth means for reprogramming said first data word into said upper bank if said means for program-verifying said first data word indicates that the programming of said first data was not successfully performed.

10. The memory device of claim 6 further including:
    (b4) fifth means for program-verifying said second data after said means for program-verifying said first data word indicates that the programming of said first data was successfully performed.

* * * * *